(12) United States Patent
Tanimoto

(10) Patent No.: US 6,452,458 B1
(45) Date of Patent: Sep. 17, 2002

(54) VOLTAGE-CONTROLLED OSCILLATOR

(75) Inventor: Susumu Tanimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/558,062

(22) Filed: Apr. 26, 2000

(30) Foreign Application Priority Data

Apr. 30, 1999 (JP) .......................................... 11-124163

(51) Int. Cl.[7] .............................................. H03L 7/099
(52) U.S. Cl. ........................ 331/57; 331/34; 331/177 R; 327/280
(58) Field of Search ........................ 331/57, 34, 177 R; 327/270, 274, 280

(56) References Cited

U.S. PATENT DOCUMENTS

| 5,264,785 A | 11/1993 | Greason ..................... 323/350 |
| 5,285,173 A | * 2/1994 | Reynolds ..................... 331/57 |
| 5,412,349 A | 5/1995 | Young et al. ................. 331/34 |
| 5,515,012 A | 5/1996 | Bhushan et al. .............. 331/17 |
| 5,563,553 A | 10/1996 | Jackson ........................ 331/57 |
| 5,821,823 A | 10/1998 | Bereza ......................... 331/57 |
| 6,294,962 B1 | * 9/2001 | Mar .............................. 331/57 |

OTHER PUBLICATIONS

Korean Office Action; Japanese translation of Korean Office Action; English translation of Office Action.
European Search dated Jul. 26, 2000.
B. Kim, et al., "A 30–MHz Hybrid Analog/Digital Clock Recovery Circuit in 2–μm CMOS", IEEE Journal of Solid–State Circuits, vol. 25, No. 6, Dec. 1990.

* cited by examiner

Primary Examiner—Arnold Kinkead
(74) Attorney, Agent, or Firm—Whitham, Curtis & Christofferson, PC

(57) ABSTRACT

A voltage-controlled oscillator 3 is constructed with a ring oscillator control circuit 2 and a ring oscillator 1, which is constructed with a plurality of differential amplifiers 5 to 8 each including a differential pair of transistors 24 and 25 and load circuits 22 and 23 connected to the respective transistors. The load circuits 22 and 23 are constructed such that the differential amplifiers always operate in linear region according to load drive voltages CL1 and CL2.

15 Claims, 18 Drawing Sheets

Fig.16 *(PRIOR ART)*

Fig.18 *(PRIOR ART)*
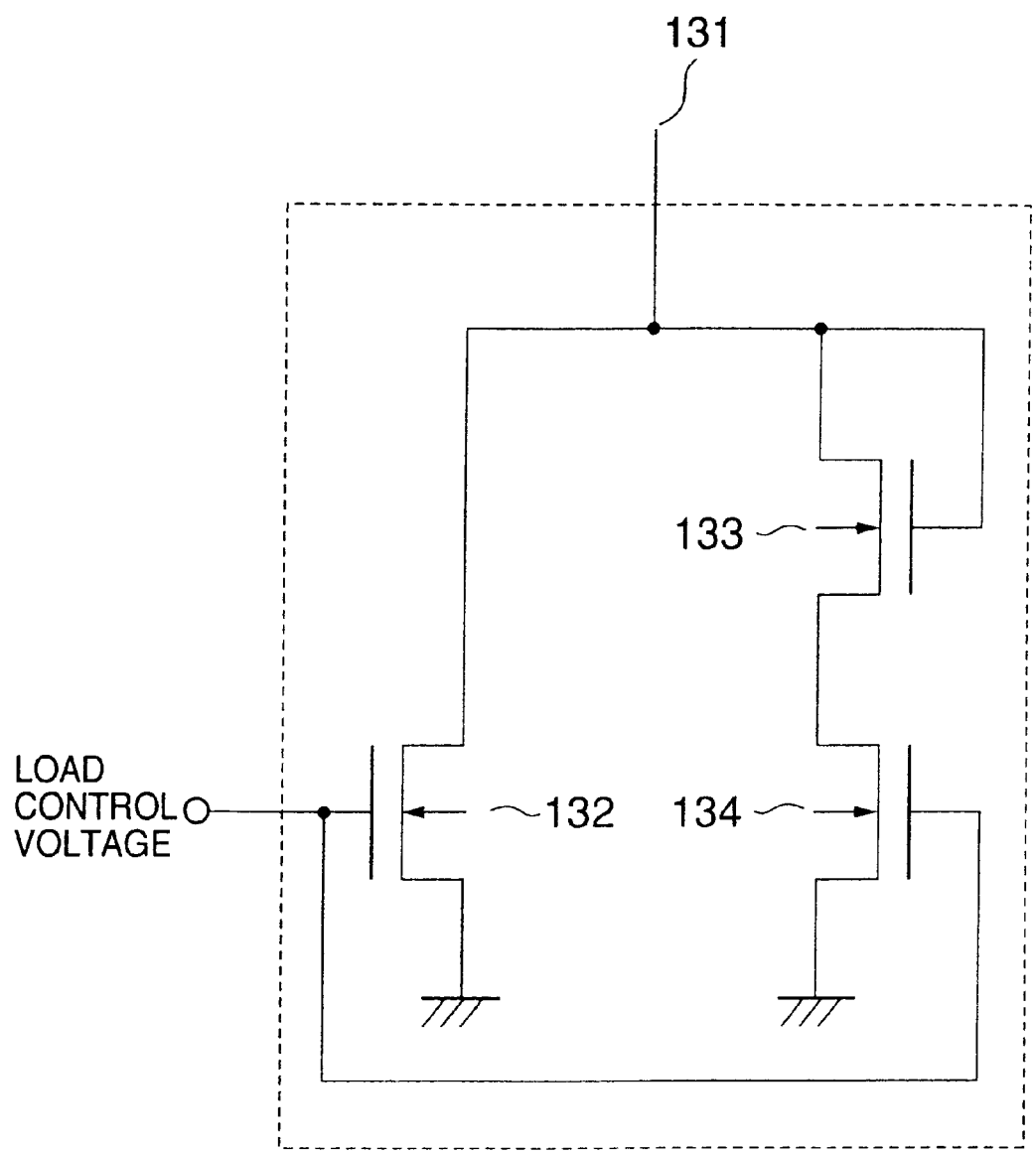

VOLTAGE-CONTROLLED OSCILLATOR

BACKGROUND OF THE INVENTION

1. Field of the Invention

The present invention relates to a voltage-controlled oscillator and, particularly, to a voltage-controlled oscillator having a ring oscillator, which is constituted with a plurality of differential amplifiers each having a load circuit.

2. Description of the Related Art

In a recent phase-locked loop (PLL) for a disk servo system of CD-ROM, etc., an output frequency range thereof, which is up to several to ten times a reference oscillation frequency of the PLL, is required. It has been known that the PLL includes a voltage-controlled oscillator whose output frequency is varied correspondingly to an input voltage thereto.

Since the recent PLL has an on-chip structure due to the recent tendency of increase of the scale of integrated circuit and the operation speed thereof, the voltage-controlled oscillator of such PLL should have a structure suitable to be integrated on a chip. That is, it has been required to develop a voltage-controlled oscillator, which is stable regardless of variation of fabrication process, does not require regulation after fabrication and is durable against noise generated in an integrated circuit.

In order to realize such voltage-controlled oscillator, a ring oscillator composed of a plurality of differential amplifiers each having a load, by which the ability of the ring oscillator can be controlled, has been proposed in, for example, IEEE Journal of Solid-State Circuits, Vol. 25, No. 6, November, 1990, pp. 1385 to 1394, IEEE Journal of Solid-State Circuits, Vol. 27, No. 11, November, 1992, pp. 1599 to 1607 and U.S. Pat. No. 5,412,349. The ring oscillator, proposed in each of these articles has characteristics suitable to be integrated on a chip, since the ring oscillator is composed of the differential amplifiers whose sensitivity to power source noise is low, the operating point variation between sampled operating points is small due to simultaneous feedback control of the operating points and the operating point variation due to relative variation within a chip can be made small because an input impedance of the load is low.

These prior arts will be described in more detail with reference to FIGS. 13 to 18. The prior art voltage-controlled oscillator is shown in FIG. 13. In FIG. 13, the voltage-controlled oscillator 103 comprises a ring oscillator 101 and a ring oscillator control circuit 102 for controlling an operation of the ring oscillator.

FIG. 14 is a block circuit diagram of the ring oscillator 101, which is constructed with differential amplifiers 105 to 108 having identical circuit constructions. Each differential amplifier includes a plus input I1, a minus input I2, a plus output O1, a minus output O2, a current control voltage terminal IC and a load control voltage terminal CL. The differential amplifiers 105 to 108 are connected in series and an output of the differential amplifier 108 is fed back in reverse phase to an input of the differential amplifier 105 to constitute a 4-stage ring oscillator 104. Since the ring oscillator 104 is composed of the differential amplifiers 105 to 108, the sensitivity thereof to power source noise is restricted due to its high ability of removing the power source voltage variation. The current control voltage terminal IC of each differential amplifier has a function of controlling a circuit current thereof and the load control voltage terminal CL thereof has a function of controlling an in-phase output voltage such that the in-phase output voltage is always equal to the reference voltage shown in FIG. 13 by regulating the performance of the load of the differential amplifier.

FIG. 15 is a circuit diagram of the ring oscillator control circuit 102 shown in FIG. 13. In FIG. 15, an NMOSFET 111 has a gate connected to an oscillation frequency control voltage terminal, which is an input terminal of the voltage-controlled oscillator 103, a source connected to a resistor 110 and a drain connected to a drain of a PMOSFET 112. The gate of the PMOSFET 112 is connected to the drain thereof and a source of the PMOSFET 112 is connected to a power source terminal 115. A differential amplifier 113 has an identical construction to that of each of the differential amplifiers 105 to 108, and input terminals I1 and I2 are commonly connected to the reference voltage terminal and output terminals O1 and O2 are commonly connected to a plus input terminal of a single-end operation amplifier 114. An output terminal of the single-end operation amplifier 114 is connected to a load control voltage terminal CL of the differential amplifier 113. The drain of the PMOSFET 112 is connected to a current control voltage terminal IC of the differential amplifier 113. A minus input terminal of the operation amplifier 114 is connected to the reference voltage source. The operation amplifier 114 controls the voltage of the load control voltage terminal CL of the differential amplifier 113 such that the output voltage of the differential amplifier 113 becomes equal to the reference voltage. Since the differential amplifier 113 has the same construction as that of any of the differential amplifiers 105 to 108, which constitute the ring oscillator 101, and the circuit current and the load control voltage thereof are also the same as those of any one of the differential amplifiers 105 to 108, its in-phase output voltage becomes equal to that of the differential amplifiers 105 to 108.

FIG. 16 is a circuit diagram of one (121) of the identical differential amplifiers 105 to 108 and 113. In FIG. 16, the differential amplifier 121 includes an input differential pair of NMOSFET's 124 and 125 and an NMOSFET 126 as a current source. Load circuits 122 and 123 have identical circuit constructions each shown in FIG. 17 or 18. The load circuit shown in FIG. 17 is composed of an NMOSFET 132 having a gate supplied with a load control voltage and an NMOSFET 133 having a gate and a drain connected to the gate thereof. A terminal 131 is connected to one of the output terminals O1 and O2 shown in FIG. 16. Since the gate of the NMOSFET 133 is connected to an output terminal 131, an impedance looked from the terminal 131 of the NMOSFET 133, that is, an output impedance, is in inverse proportion to a mutual conductance of the NMOSFET 133 and has a low value. Further, since the NMOSFET 132 having the gate supplied with the load control voltage operates in a saturation region, when the load control voltage is low and the following relation is established between the voltage Vo at the output terminal 131 and the load control voltage VCl:

$$VCL - Vth < Vo$$

where Vth is the threshold voltage of the NMOSFET 132. Therefore, the output impedance of the load becomes very large. That is, the output impedance is represented by $\Delta V / \Delta i$, a ratio of voltage change $\Delta V$ to current change $\Delta i$. In the saturation region, since current i is substantially constant, $\Delta i$ is very close to 0 and the output impedance becomes substantially infinite. However, in order to make the in-phase output voltage constant even when the operating current is changed, the NMOSFET 132 whose performance can be controlled by the load control voltage is indispensable. That is, it is impossible to control the in-phase output voltage by only the NMOSFET 133 since the in-phase output voltage is varied by the operating current. Consequently, it becomes possible by using both the NMOSFET's 132 and 133 to reduce the output impedance of the load to a low value and to make the in-phase output voltage constant.

The load circuit shown in FIG. 18 includes, in addition to the NMOSFET's 132 and 133 shown in FIG. 17, an NMOSFET 134 having a gate supplied with the load control voltage and provided on the source side of the NMOSFET 133. In the load circuit shown in FIG. 17, when the operating current is reduced and a substantial portion of the operating current flows through the NMOSFET 133, an amplitude of the oscillation frequency output is reduced in a range of operating current smaller than the operating current. In the load circuit shown in FIG. 18, such phenomenon does not occur due to the provision of the NMOSFET 134.

In this case, however, since an output impedance of the series circuit including the NMOSFET's 133 and 134 is determined by the NMOSFET 134, the output impedance of the series-connected NMOSFET's 133 and 134 becomes very large when the NMOSFET 134 operates in the saturation region. As a result, there is a lower limit of the output frequency range of the voltage-controlled oscillator 103 constituted with the differential amplifiers 121.

Now, the reason for the necessity of maintaining the in-phase output voltage at constant will be described. In order to connect the voltage-controlled oscillator to a usual CMOS digital circuit, it is necessary to convert the differential output of the ring oscillator 101, that is, the voltage-controlled oscillator 103, into a single-ended CMOS level. In order to realize such conversion, it is necessary to stabilize the in-phase output voltage of the differential output of the voltage-controlled oscillator 103, otherwise, a circuit for converting the differential output into the single-ended CMOS level does not operate normally or, if it operates normally, the operating speed and/or the duty cycle may be degraded.

The purpose of reduction of the output impedances of the loads is to prevent the operating points of the differential amplifiers 105 to 108 from being substantially varied due to relative variation between the current source transistors 126 of the differential amplifiers 105 to 108 and 113 and transistors constituting the load circuits and to restrict the influence of coupling through other wiring and/or a silicon substrate of the integrated circuit.

As mentioned, although the voltage-controlled oscillator including the ring oscillator constituted with the differential amplifiers 121 each having the load circuit shown in FIG. 17 or 18 has characteristics suitable for circuit integration, the range of oscillation frequency thereof is narrow. Therefore, it is difficult to use the prior art voltage-controlled oscillator for the PLL of the disk servo system of such as CD-ROM, which requires the output frequency range from several to ten times the reference frequency.

Further, although the load circuit shown in FIG. 17 or 18 includes a transistor having a gate short-circuited to a drain thereof, the in-phase output voltage of the differential amplifier must be high enough when the threshold value of the transistor is high. However, when the in-phase output voltage is high, the paired differential transistors 124 and 125 are not saturated, so that it becomes impossible to obtain a voltage gain. Therefore, it is necessary to sufficiently reduce the in-phase output voltage of the differential amplifier 121. Accordingly, special fabrication steps dedicated thereto must be added in order to reduce the threshold voltage of the transistors constituting the load circuit.

SUMMARY OF THE INVENTION

An object of the present invention is to provide a voltage-controlled oscillator having a wide oscillation output frequency range, which can be fabricated without adding any special fabrication step to a usual fabrication method of a voltage-controlled oscillator.

In order to achieve the above object, a voltage-controlled oscillator according to a first aspect of the present invention includes a ring oscillator constituted with a plurality of differential amplifiers each having a first input terminal, a second input terminal, a first output terminal, a second output terminal and a current limiting terminal, the first and second input terminals of the differential amplifiers being ring-connected to the corresponding first and second output terminals of the differential amplifiers, a first load circuit connected to each of the first output terminal, a second load circuit connected to each second output terminal and is featured by that the first and second load circuits always operate in a linear region.

A voltage-controlled oscillator according to a second aspect of the present invention includes a ring oscillator constituted with a plurality of differential amplifiers each having a first input terminal, a second input terminal, a first output terminal, a second output terminal and a current limiting terminal, the first and second input terminals of the differential amplifiers being ring-connected to the corresponding first and second output terminals of the differential amplifiers, a first load circuit connected to each of the first output terminal and supplied with a first and second load control voltages, a second load circuit connected to each second output terminal and supplied with the first and second load control voltages and is featured by that the first and second load circuits always operate in a linear region according to the first and second load control voltages.

With such circuit construction of the voltage-controlled oscillator, an output impedance of the differential amplifies is always restricted to a low level, so that it is possible to widen the oscillation frequency thereof.

BRIEF DESCRIPTION OF THE DRAWINGS

The above-mentioned and other objects, features and advantages of the present invention will become more apparent by reference to the following detailed description of the invention taken in conjunction with the accompanying drawings, in which:

FIG. 18 is a circuit diagram of another load circuit shown in FIG. 16.

DETAILED DESCRIPTION OF THE PREFERRED EMBODIMENTS

A voltage-controlled oscillator according to a first embodiment of the present invention will be described with reference to FIG. 1.

Figure 1:
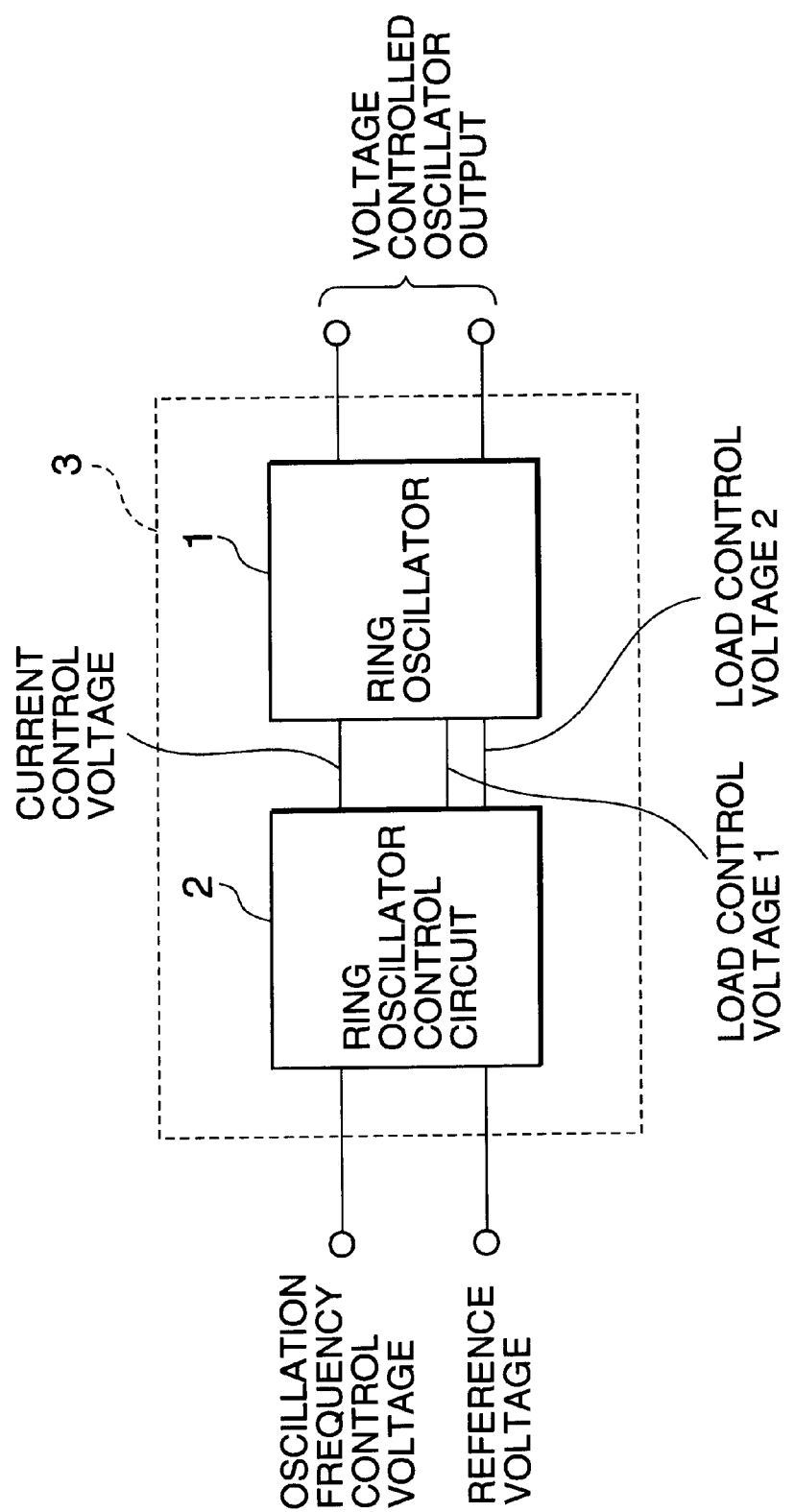
FIG. 1 is a block circuit diagram of a voltage-controlled oscillator according to a first embodiment of the present invention.
Figure 2:
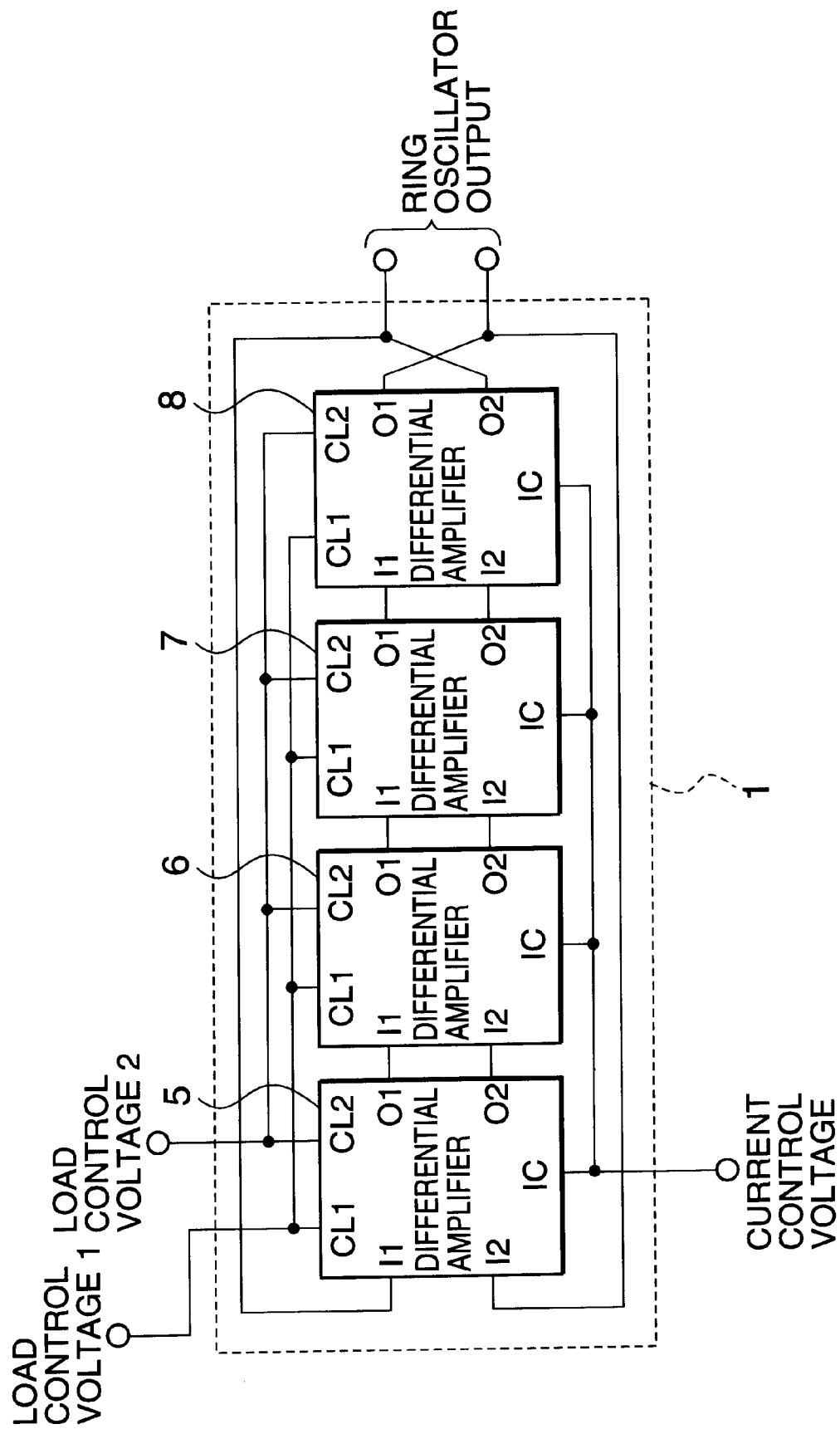
FIG. 2 is a block circuit diagram of a ring oscillator shown in FIG. 1.

In FIG. 1, a voltage-controlled oscillator 3 includes a ring oscillator control circuit 2 supplied with an oscillation frequency control voltage and a reference voltage and a ring oscillator 1 supplied with a current control voltage and load control voltages 1 and 2, which are outputted by the ring oscillator control circuit 2. An output of the ring oscillator 1 becomes an output of the voltage-controlled oscillator 3. FIG. 2 is a circuit diagram of the ring oscillator 1 shown in FIG. 1. The ring oscillator 1 is constituted with a plurality of differential amplifiers, in this embodiment, four differential amplifiers 5 to 8, each having a plus input terminal I1, a minus input terminal I2, a plus output terminal O1, a minus output terminal O2, a current control voltage terminal IC and a pair of load control voltage terminals CL1 and CL2. The differential amplifiers 5 to 8 are connected in series in this order and the outputs at the output terminals O1 and O2 of the differential amplifier 8 are fed back to the inputs of the differential amplifier 5 in inverse phase to constitute a 4-stage ring oscillator. The oscillation frequency of the ring oscillator 1 is controlled by changing an operating current thereof by a current control voltage supplied to the current control voltage terminal IC while regulating the in-phase output voltage thereof constant by the load control voltage at the load control voltage terminals CL1 and CL2. Although the shown ring oscillator has the 4-stage construction, it has been well known that the ring oscillator can function as an oscillator when there are at least 3-stage construction.

Figure 4:
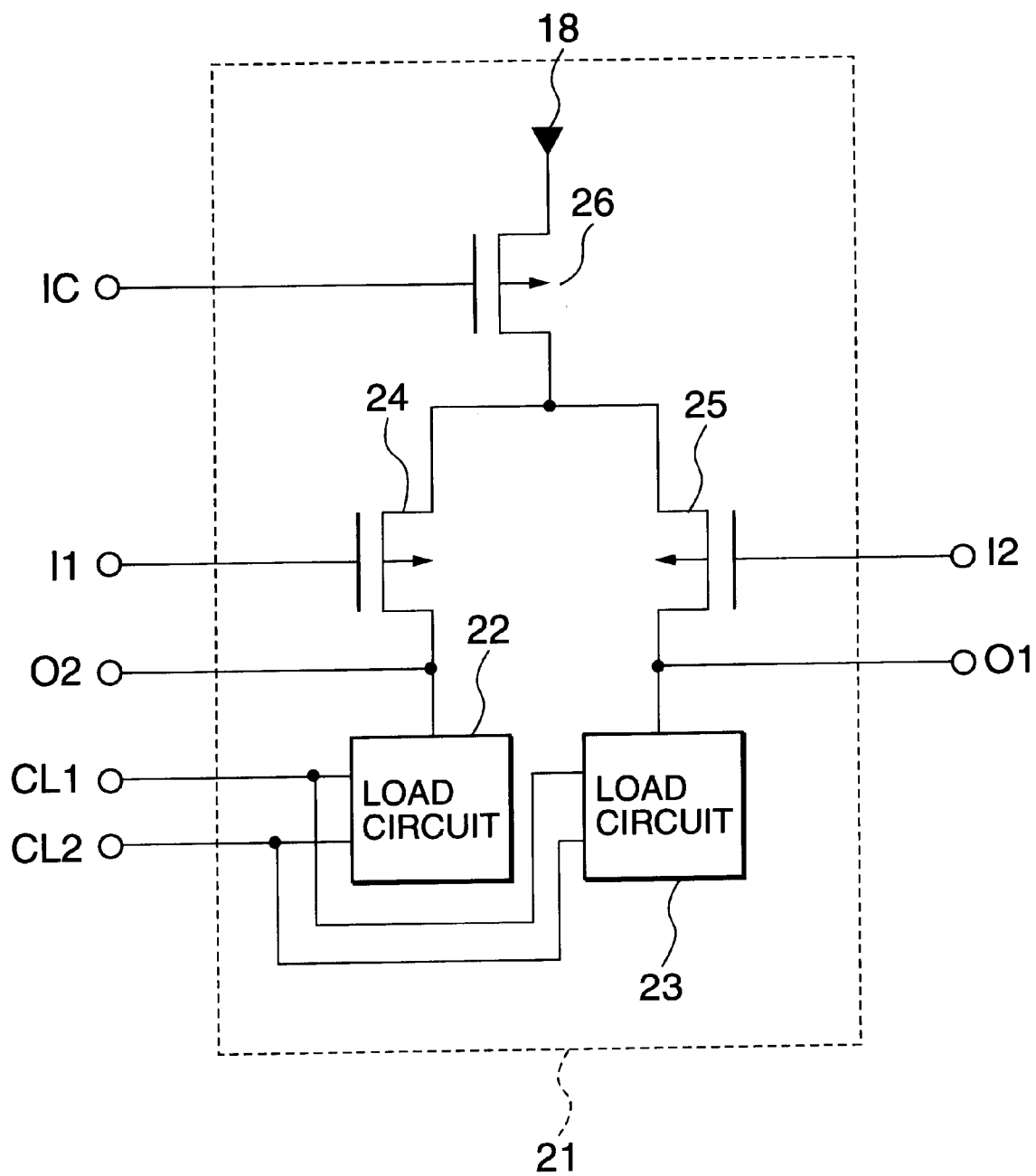
FIG. 4 is a circuit diagram of a differential amplifier shown in FIG. 2 or 3.

The differential amplifiers 5 to 8 have identical constructions, one of which is shown as a differential amplifier 21 in FIG. 4. As shown in FIG. 4, the differential amplifier 21 includes load circuits 22 and 23 supplied with load control voltages 1 and 2 from the load control voltage terminals CL1 and CL2, a differential pair of PMOSFET's 24 and 25 having gates connected to the input terminals I1 and I2 and drains connected to the output terminals O2 and O1, respectively, and a PMOSFET 26 having a gate connected to the current control terminal IC and a source connected to the power source line 18 to constitute a current source.

Figure 5:
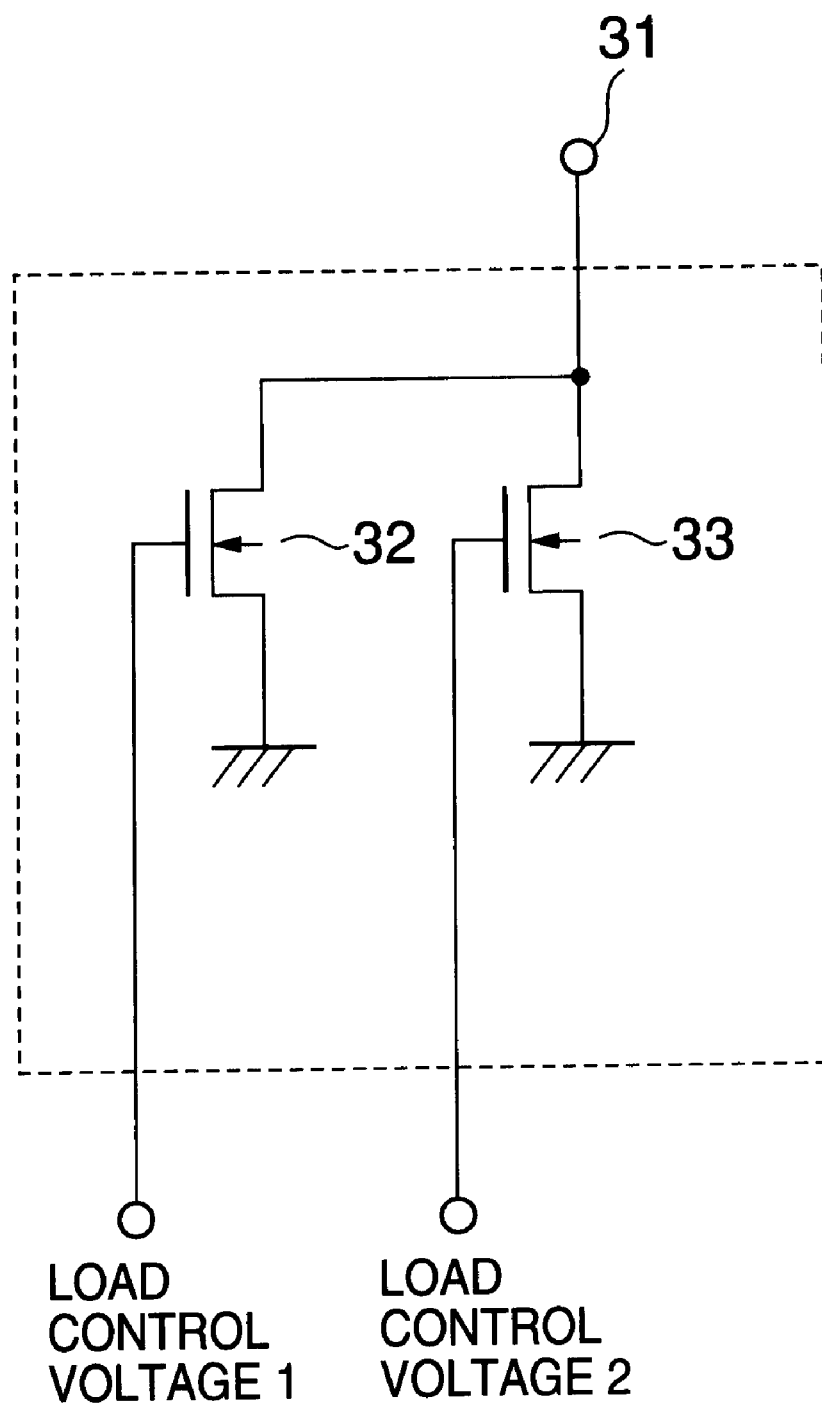
FIG. 5 is a circuit diagram of a load circuit shown in FIG. 4.
Figure 6:
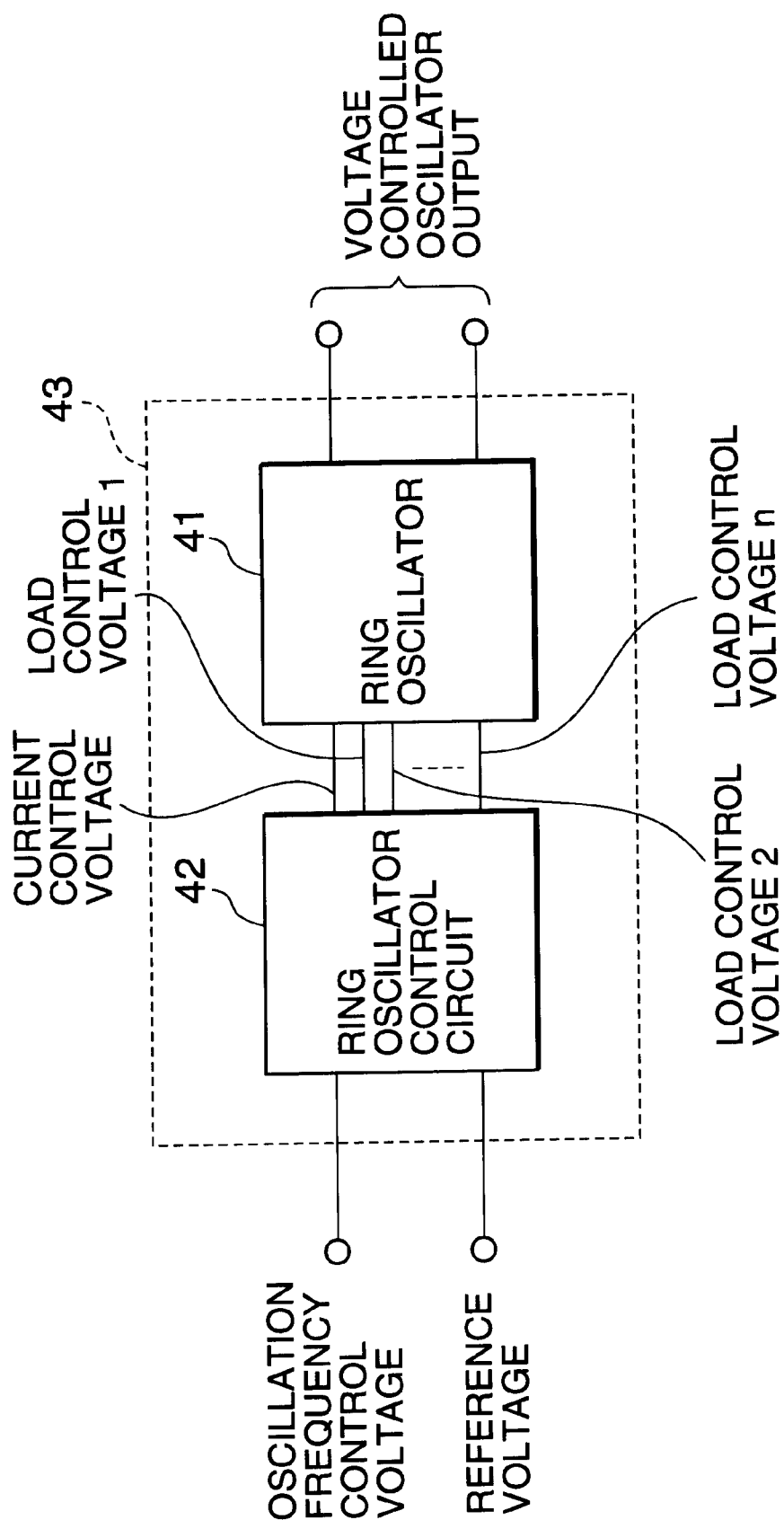
FIG. 6 is a block circuit diagram of a voltage-controlled oscillator according to a second embodiment of the present invention.
Figure 7:
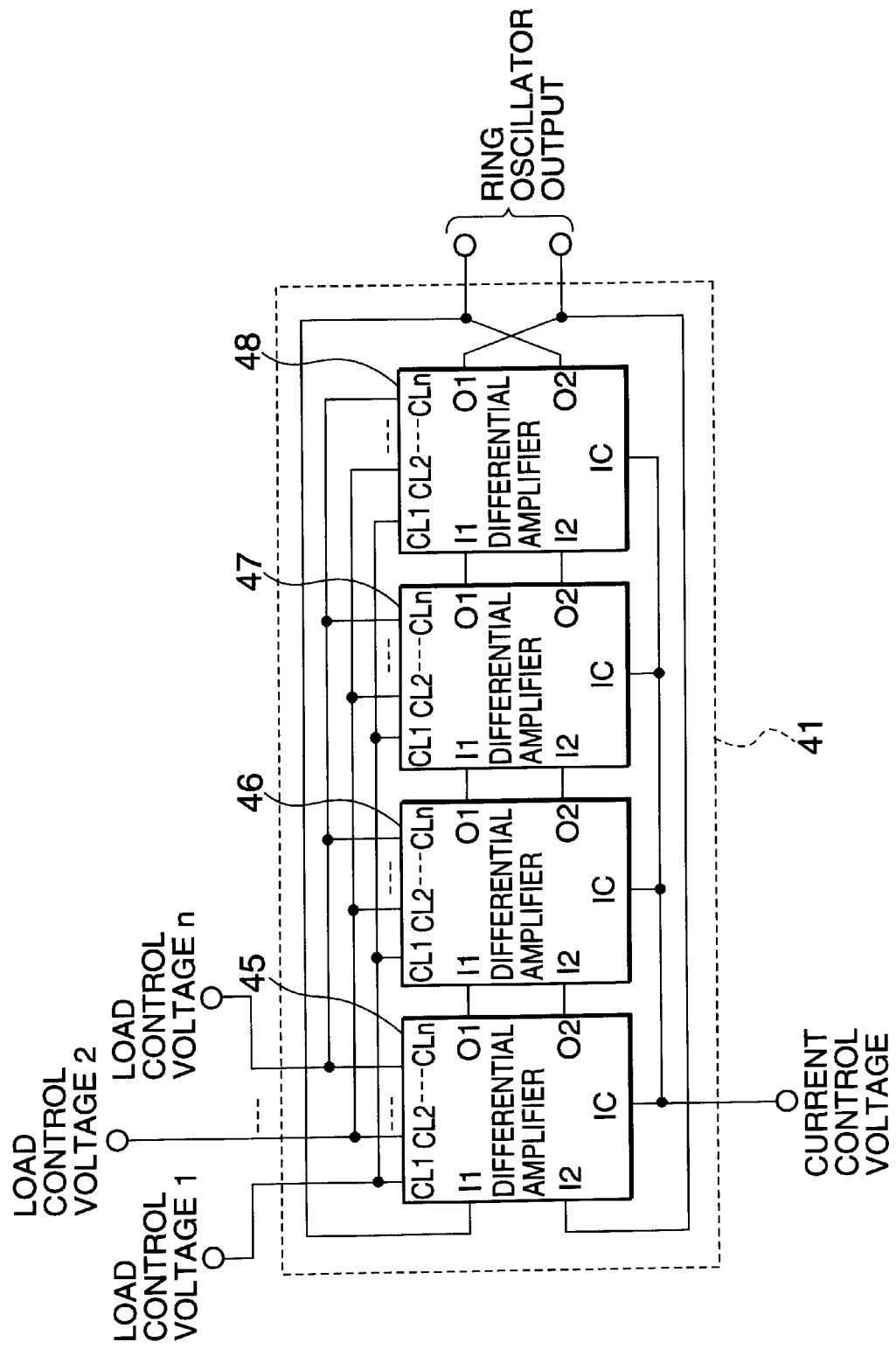
FIG. 7 is a block circuit diagram of a ring oscillator shown in FIG. 6.

As shown in FIG. 5, each of the load circuits 22 and 23 of the differential amplifier shown in FIG. 4 includes an NMOSFET 32 having a gate supplied with the load control voltage 1 and an NMOSFET 33 having a gate supplied with the load control voltage 2. Assuming that (gate width)/(gate length) of the NMOSFET 32 is K32 and (gate width)/(gate length) of the NMOSFET 33 is K33, K32 is set equal to or larger than K33. An output terminal 31 of the load circuit 22 is connected to the drain of the PMOSFET 24 and an output terminal 31 of the load circuit 23 is connected to the drain of the PMOSFET 25.

Figure 3:
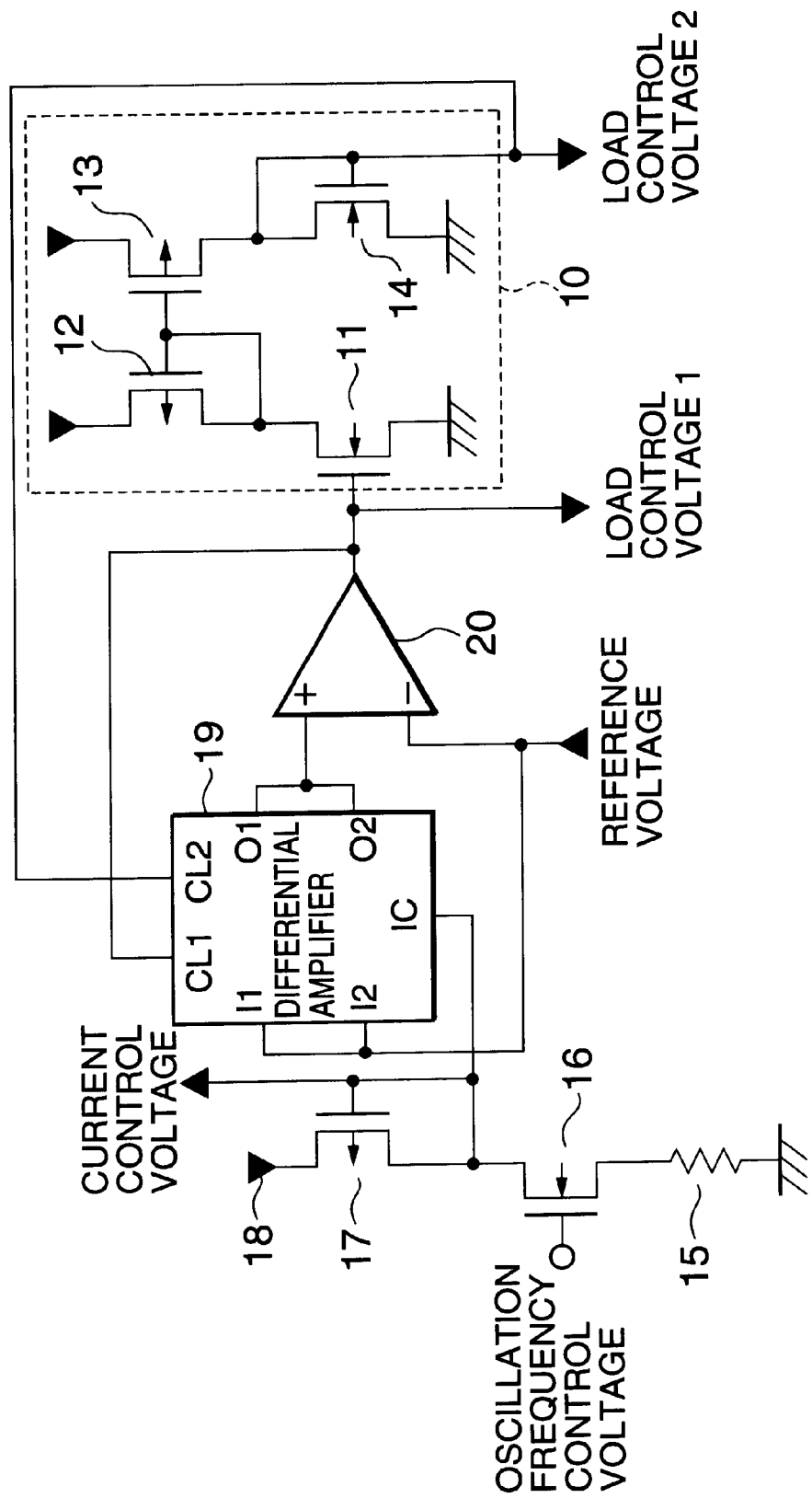
FIG. 3 is a circuit diagram of a ring oscillator control circuit shown in FIG. 1.

A construction of the ring oscillator control circuit 2 shown in FIG. 1 is shown in FIG. 3. As shown in FIG. 3, the ring oscillator control circuit 2 includes an NMOSFET 16 having a gate supplied with the oscillation frequency control voltage, which is the input terminal of the voltage-controlled oscillator, a resistor 15 connected between ground and a source of the NTMOSFET 16, a PMOSFET 17 having a drain and a gate, both of which are commonly connected to a drain of the NMOSFET 16, and a source connected to the voltage source line 18, a differential amplifier 19 having a current control terminal IC supplied with a current control voltage generated at a junction between the PMOSFET 17 and the NMOSFET 16, an operation amplifier 20 having a plus input supplied with an output of the differential amplifier 19 and outputting the load control voltage 1 and a voltage amplifier 10 supplied with the load control voltage 1 and outputting the load control voltage 2. The operating currents of the differential amplifiers 5 to 8 are controlled by the current control voltage supplied to the current control terminals IC thereof.

The differential amplifier 19 may be any provided that it outputs a voltage equal to the in-phase output voltage of one of the differential amplifiers 5 to 8. In this embodiment, however, the differential amplifier 19 has a circuit construction identical to that of one of the differential amplifiers 5 to 8 and has a plus and a minus inputs terminals I1 and I2 commonly supplied with the reference voltage, which is the input of the voltage-controlled oscillator 3, and output terminals O1 and O2 connected commonly to the plus input of the operational amplifier 20. Alternatively, the differential amplifier 19 may take other constructions. For example, the differential amplifier 19 may have the same circuit construction as that of the differential amplifier 21 shown in FIG. 4 with the gate width of the current source 26 being made 1/2 and the load circuit 23 and the transistor 25 being removed. Alternatively, the differential amplifier 19 may have the same circuit construction as that of the differential amplifier 21, with the PMOSFET's 24 and 25 being removed and the PMOSFET 26 being directly connected to the load circuits 22 and 23. In the latter case, the reference voltage is not supplied thereto.

The voltage amplifier 10 is constituted with an NMOSFET 11 having a source grounded and a gate supplied with the load control voltage 1, a PMOSFET 12 having a source connected to the voltage source line 18 and a gate and a drain, which are commonly connected to a drain of the NMOSFET 11, a PMOSFET 13 having a source connected to the voltage source line 18 and a gate connected to the gate of the PMOSFET 12 and an NMOSFET 14 having a source grounded and a drain and a gate, which are commonly connected to a drain of the PMOSFET 13. A drain voltage of the NMOSFET 14 is outputted as the load control voltage 2. The load control voltage 2 is supplied to the differential amplifier 19 and the differential amplifiers 5 to 8 constituting the ring oscillator 1.

An operation of the voltage-controlled oscillator 3 according to this embodiment will be described.

The voltage-controlled oscillator 3 outputs an oscillation frequency, which is controlled by the oscillation frequency control voltage inputted to the ring oscillator control circuit 2, as shown in FIG. 1. In the circuit shown in FIG. 1, the oscillation frequency is increased with increase of the oscillation frequency control voltage. This operation will be described first.

The operating current of each of the differential amplifier 19 and the differential amplifiers 5 to 8 is supplied from the, current source, that is, the PMOSFET 26 having the gate supplied with the IC terminal voltage, and is determined by the Miller effect of a current flowing through a source-drain circuit of the PMOSFET 17 shown in FIG. 3. The current flowing through the source-drain circuit of the PMOSFET 17 is the same as a current flowing through the resistor 15. The current flowing through the resistor 15 is substantially zero when the oscillation frequency control voltage is equal to or lower than the threshold voltage of the NMOSFET 16. It is well known that, when the oscillation frequency control voltage exceeds the threshold voltage of the NMOSFET 16, the current flowing through the resistor 15 becomes substantially proportional to a current represented by the following formula:

$$\{(\text{oscillation frequency control voltage})-(\text{threshold voltage of NMOSFET 16})\}/R \quad (1)$$

where R is a resistance value of the resistor 15. Therefore, the operating current of each of the differential amplifiers 5 to 8 and 19 is substantially proportional to the formula (1).

Incidentally, the oscillation frequency of the ring oscillator 1 is represented by the following formula:

$$1/(2\pi CLRL) \quad (2)$$

where CL is a load capacitance of the outputs O1 and O2 of each of the differential amplifiers 5 to 8, which includes drain junction capacitances of the PMOSFET's 24 and 25 and the NMOSFET's 32 and 33, which constitute the load circuits 22 and 23, gate capacitances of the PMOSFET's 24 and 25 of a next stage and a capacitance of a wiring and RL is an output impedance of the output O1 and O2, which is a sum of output impedances of the load circuit 22 and the PMOSFET 24 or a sum of output impedances of the load circuit 23 and the PMOSFET 25. The reason for that the oscillation frequency is given by the formula (2) will be described. The oscillation frequency given by the formula (2) is a first pole frequency of the differential amplifiers 5 to 8 and a phase of the output of the differential amplifiers 5 to 8 is rotated by 45° at this frequency. Further, the oscillation occurs at a frequency at which the phase from the input to the differential amplifier 5 to the output of the differential amplifier 8 is rotated by 180° and, since the ring oscillator 1 has the 4-stage construction, the oscillation occurs at a frequency whose phase for one stage is rotated by 45°. Therefore, the ring oscillator 1 oscillates at the first pole frequency. Needless to say, RL is reduced when the circuit current increases. Therefore, since the operating current is substantially proportional to the formula (1), the output frequency of the voltage-controlled oscillator 3 increases when the oscillation control voltage becomes high. Since there is no current flows when the oscillation frequency control voltage is in the ground potential level, the oscillation is terminated. Although an oscillation frequency of a ring oscillator having other construction than 4-stage construction is given by a formula different from the formula (2), the oscillation frequency can be obtained in a similar manner and the output frequency of the voltage-controlled oscillator also increases with increase of the oscillation frequency control voltage.

Now, the reason for that the output impedance of the differential amplifiers 5 to 8 constituting the ring oscillator 1 of this embodiment can be reduced will be described. First, a relation between the load control voltage 1 and the load control voltage 2 in FIG. 2 will be described. Here, it is assumed that, in FIG. 3, (gate width)/(gate length) ratios of the NMOSFET's 11, 12 and the PMOSFET's 13 and 14 are represented by K11, K12, K13 and K14, respectively, the threshold voltages of the NMOSFET's 11 and 14 are commonly Vtn and the threshold voltages of the PmOSFET's 12 and 13 are commonly Vtp. The MOSFET's 11 to 14 are set to operate in saturation regions respectively. In such case, currents I11 to I14 flowing through the MOSFET's 11 to 14 are given by the following formulas, respectively:

$$I11=\mu n Cox K11\ (Vgsn11-Vtn)2/2 \quad (3)$$

$$I12=\mu n Cox K12\ (Vgsp-Vtp)2/2 \quad (4)$$

$$I13=\mu n Cox K13\ (Vgsp-Vtp)2/2 \quad (5)$$

$$I14=\mu n Cox K14\ (Vgsn14-Vtn)2/2 \quad (6)$$

where $\mu n$ and $\mu p$ are mobilities of electron and hole in silicon, Cox is a gate capacitance for unit area, Vgsn11 is a voltage between the gate and the source of the NMOSFET 11, Vgsp is a voltage between the gate and the source of the PMOSFET 12 as well as the PMOSFET 13 and Vgsn14 is a voltage between the gate and the source of the NMOSFET 14. Since the gates of the PMOSFET's 12 and 13 are common and the sources thereof are commonly connected to the voltage source 18, the voltages between the gates and the sources thereof are equal each other. Further, since currents flowing through the NMOSFET 11 and the PMOSFET 12 are the same and currents flowing through the PMOSFET 13 and the NMOSFET 14 are the same, the following formulas are established:

$$I11=I12 \quad (7)$$

$$I13=I14 \quad (8)$$

From the formulas (3) to (8), the following formula is obtained:

$$Vgsn14-Vtn=\{K11\ K13/(K12K14)\}1/2(Vgsn11-Vtn) \quad (9)$$

From the formula (9), it is clear that (Vgsn14−Vtn) is always equal to (Vgsn11−Vtn) multiplied with $\{K11K13/(K12K14)\}1/2$. For example, when K11 is twice K12 and K13 is twice K14, the voltage (Vgsn14−Vtn) is always twice the voltage (Vgsn11−Vtn). That is, by setting K11 to K14, which are ratios of the gate widths to the gate lengths of the respective MOSFET's 11 to 14, to suitable values, it is possible to always make the difference between the load control voltage 2 and Vtn a constant number multiple of the difference between the load control voltage 1 and Vtn. Therefore, it is possible, in the load circuits 22 and 23, which are constituted with the NMOSFET's 32 and 33, respectively, to arbitrarily make the voltage between the gate and the source of the NMOSFET 33 higher than the voltage between the gate and the source of the NMOSFET 32. Consequently, it is possible to operate the NMOSFET 33 in a linear region even when the voltage value of the load control voltage 1 allows the NMOSFET 32 to operate in the saturation region. It has been known that the operation region of the NMOSFET 32 or 33 is determined by (voltage between gate and source)−(threshold voltage)

since, in this embodiment, the in-phase output voltage is fixed to the reference voltage. Since it is possible to set this voltage of the NMOSFET 33 to an arbitrary high value according to the formula (9), it is possible to make the load control voltage 2 to a value with which the NMOSFET 33 operates in the linear region by setting the values of K13 and K14, even when the oscillation frequency control voltage is low and the load control voltage 1 is low enough to operate the NMOSFET 32 in the saturation region. Incidentally, same operation can be obtained by using a voltage amplifier having high voltage gain preciseness instead of the voltage amplifier 10.

Further, it is necessary to make the driving ability of one of the NMOSFET's 32 and 33 constituting the respective load circuits 22 and 23, which reaches the saturation region first, smaller than that of the other, which is operating in the linear region. This is because, if the driving ability of the NMOSFET operating in the saturation region becomes dominant, the output impedance of the NMOSFET operating in the linear region does not attribute substantially to the output impedance of the output 31 of the load circuit, so that the output impedance of the output 31 of the load circuit becomes large. Therefore, it is enough to make the gate width of the NMOSFET operating in the linear region larger than that of the NMOSFET operating in the saturation region. Since the gate width can be made large by connecting NMOSFET's in parallel, without increasing the number of fabrication steps.

Figure 8:
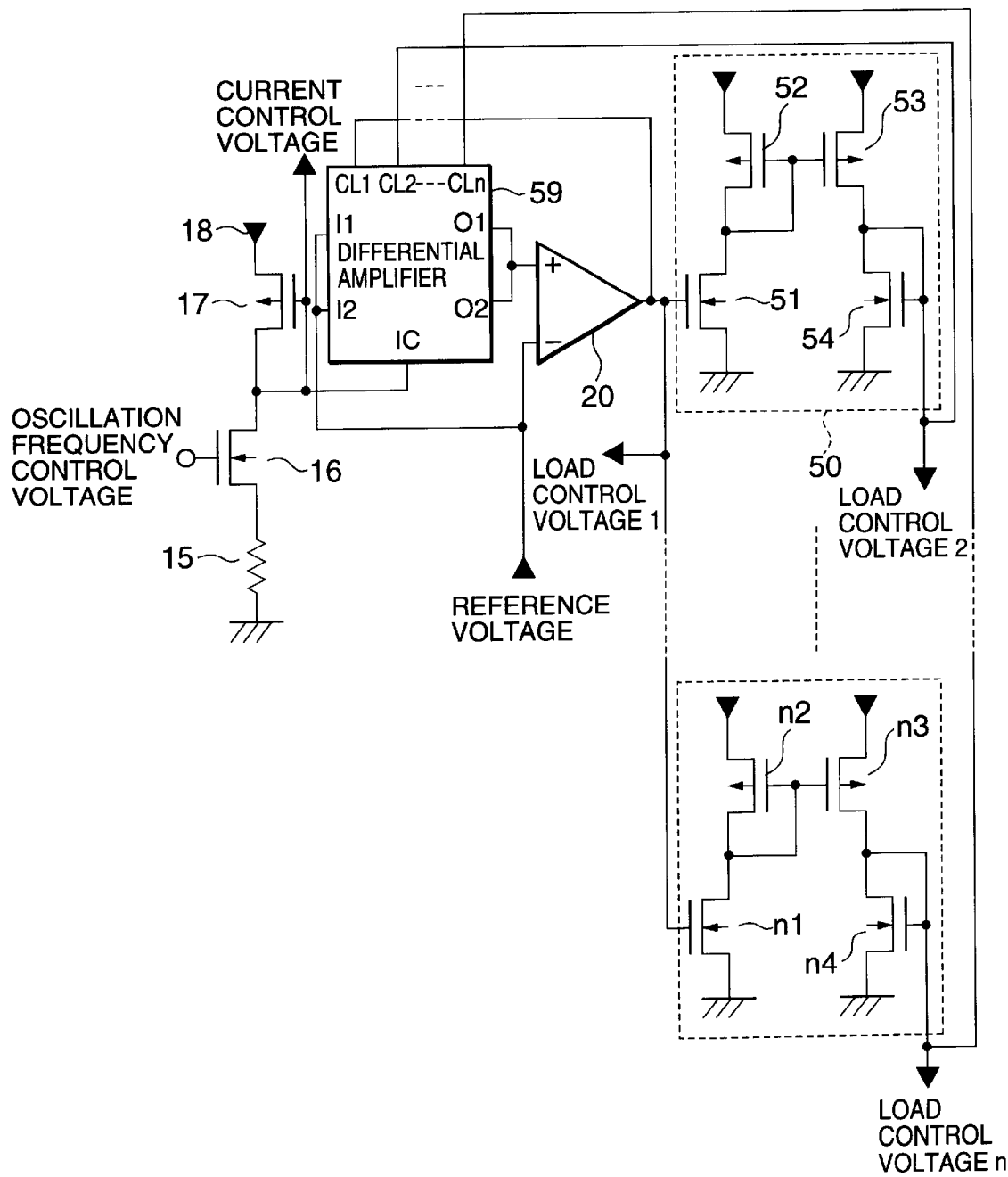
FIG. 8 is a circuit diagram of a ring oscillator control circuit shown in FIG. 6.
Figure 9:
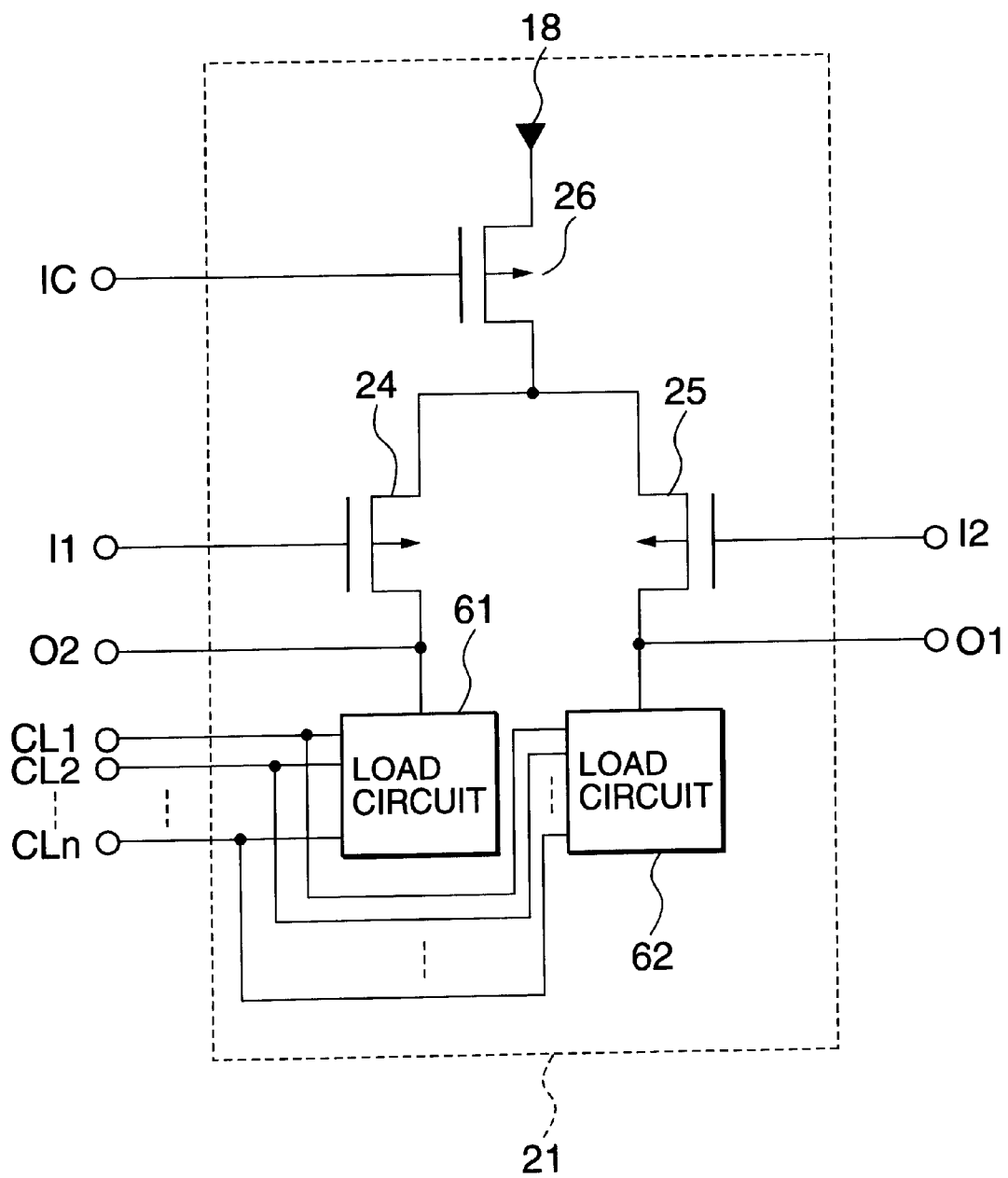
FIG. 9 is a circuit diagram of a differential amplifier shown in FIG. 7 or 8.
Figure 10:
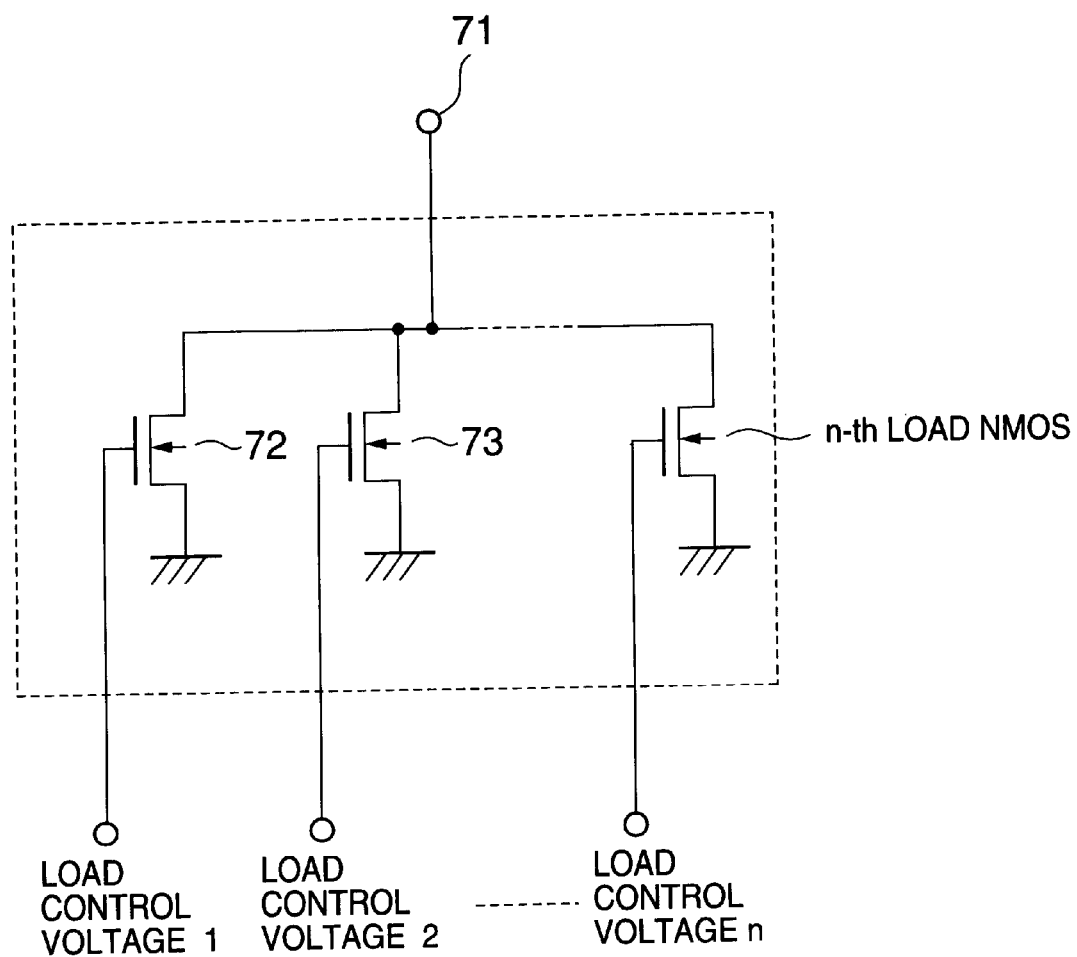
FIG. 10 is a circuit diagram of a load circuit shown in FIG. 9.

A second embodiment of the present invention is shown in FIGS. 6 to 10. The basic construction of the second embodiment is the same as that of the first embodiment, except that the load circuit includes n transistors connected in parallel as shown in FIG. 10 and n load control voltages are provided correspondingly to the n transistors, as shown in FIG. 10, where n is an integer larger than 2. The n load control voltages are generated by a ring oscillator control circuit, which includes (n−1) voltage amplifiers 50 each identical to the voltage amplifier 10 shown in FIG. 3, as shown in FIG. 8. Assuming that values obtained for the respective n load control voltages according the formula {K11K13/(K12K14)}1/2 determining the voltage amplification obtained in the first embodiment are α1, α2, . . . , αn-1, these values are set in this embodiment as follow:

$$\alpha 1 < \alpha 2 < \ldots < \alpha n\text{-}1$$

That is, the load control voltages are set in such a way of (load control voltage)<(load control voltage 2)< . . . <(load control voltage n).

With such circuit construction, it is possible to operate any one of the transistors constituting the load circuit in the linear region within a wider operating current range than that of the first embodiment. That is, it is possible to reduce the output impedance of the differential amplifiers constituting the ring oscillator in the wider operating current range to thereby obtain the voltage-controlled oscillator having a wider stable oscillation frequency range.

It is further effective when the driving ability of the transistors is changed such that the driving ability of transistors operating in the saturation region becomes smaller than that of the transistors operating in the linear region.

Figure 11:
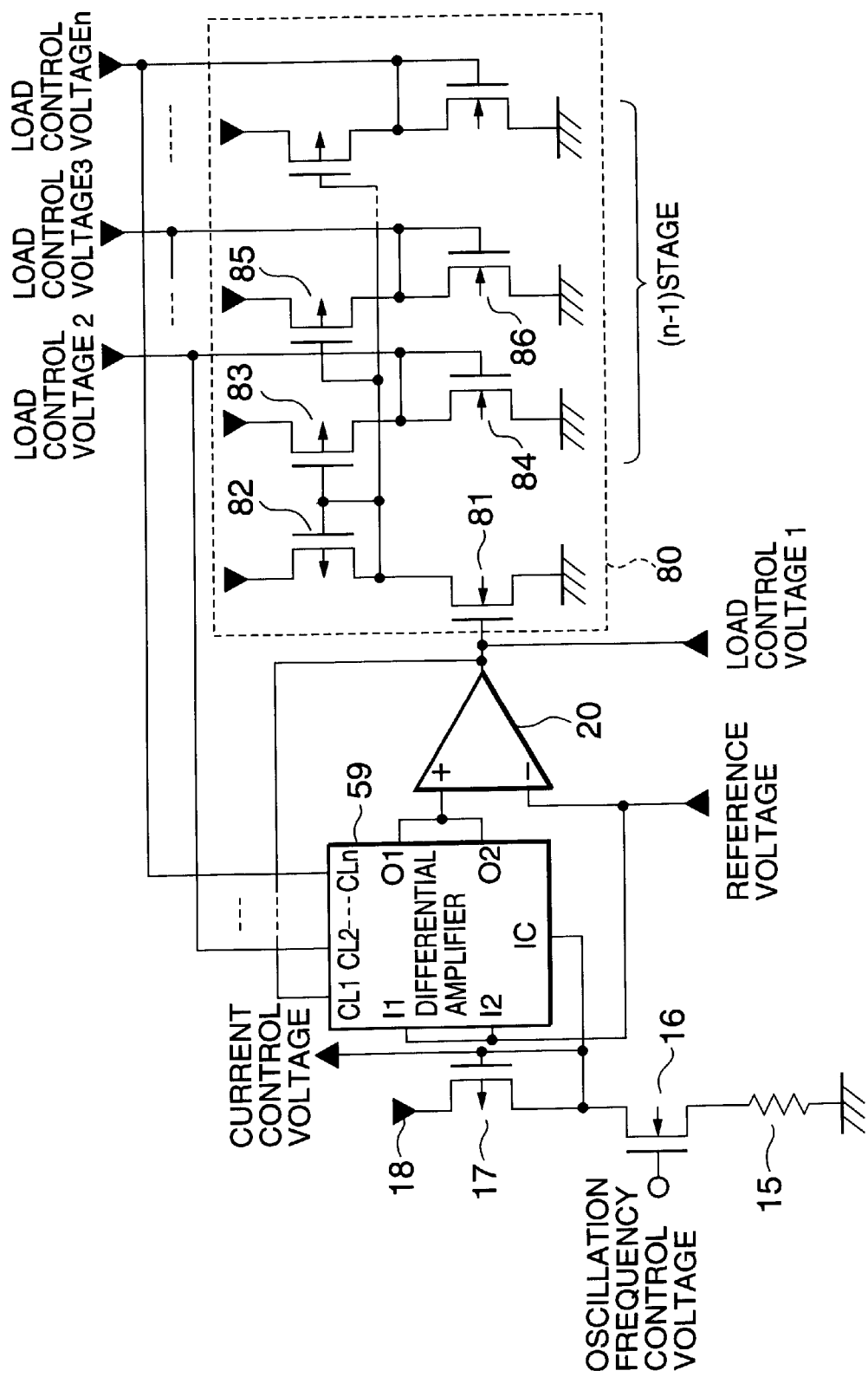
FIG. 11 is a circuit diagram of a modification of the ring oscillator shown in FIG. 8.

The ring oscillator control circuit shown in FIG. 8 may be replaced by a ring oscillator control circuit shown in FIG. 11. In such case, the number of transistors can be reduced, compared with the ring oscillator control circuit shown in FIG. 8. The ring oscillator control circuit shown in FIG. 11 operates in a similar manner to the ring oscillator control circuit shown in FIG. 8 by replacing the values of K13 and K14 of the formula {K11K12/(K13K14)}1/2 obtained for the load circuit 10 shown in FIG. 3 by those corresponding to the respective transistors.

Figure 12:
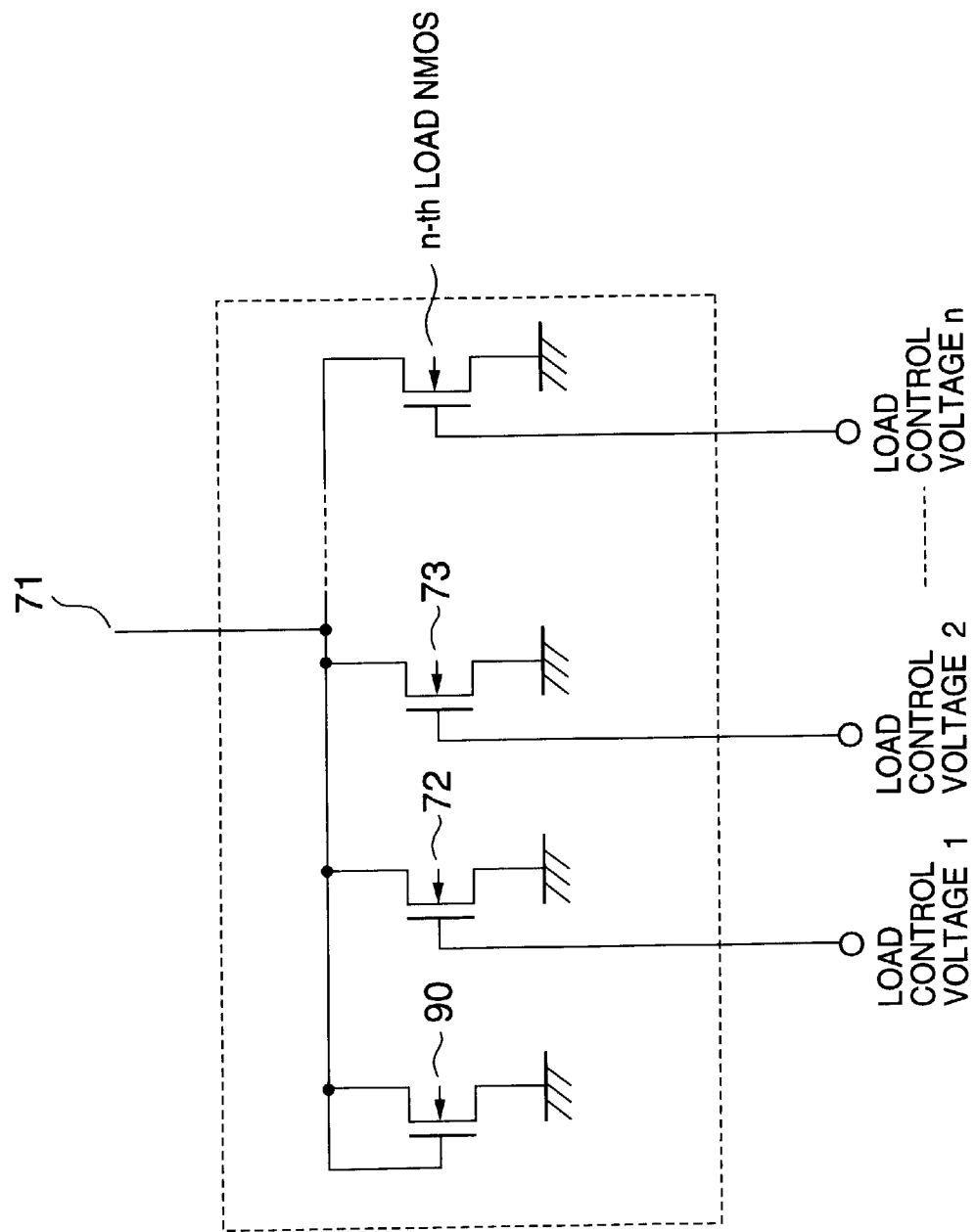
FIG. 12 is a circuit diagram of a modification of the load circuit shown in FIG. 9.
Figure 13:
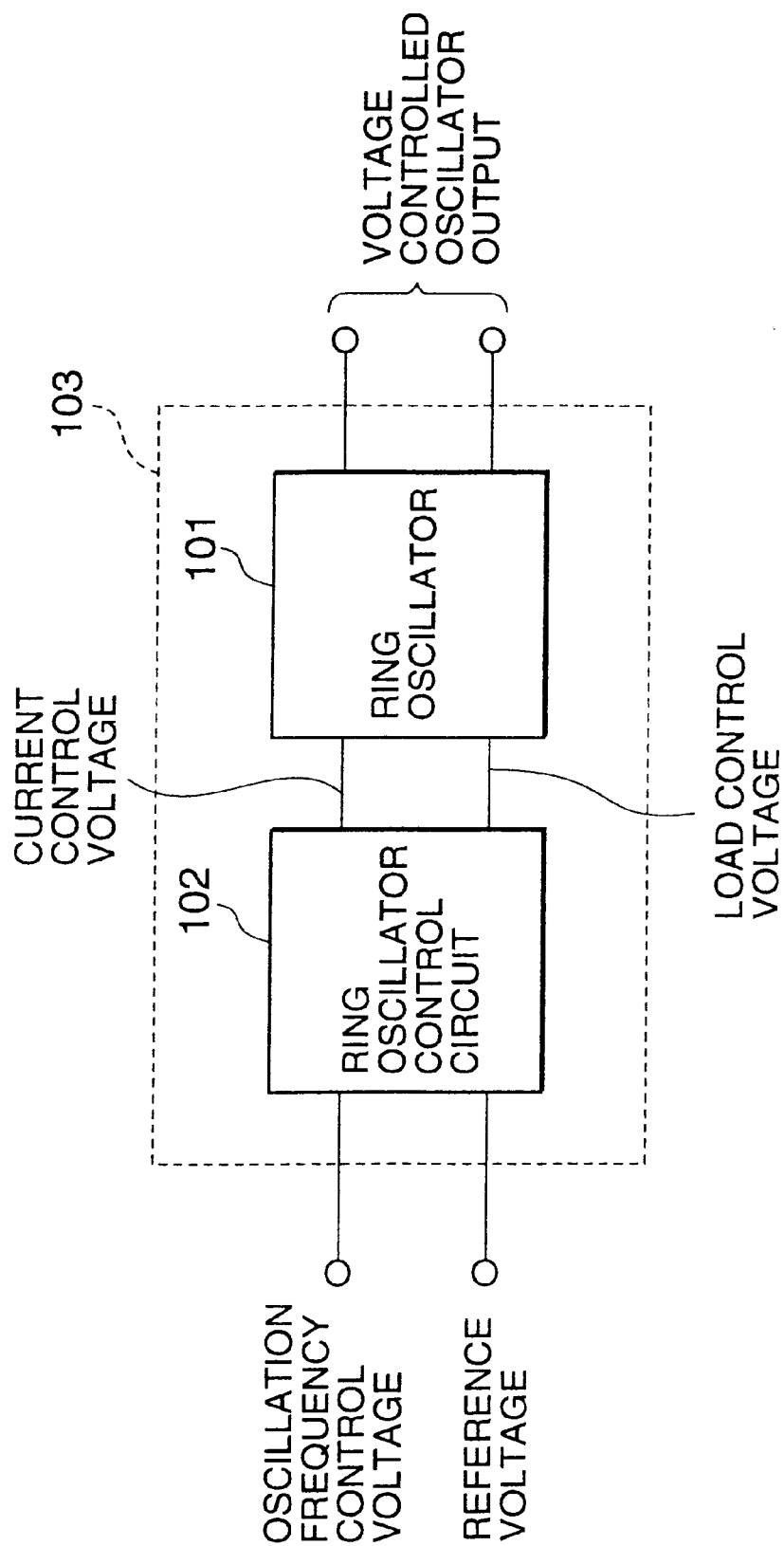
FIG. 13 is a block circuit diagram of a conventional voltage-controlled oscillator.
Figure 14:
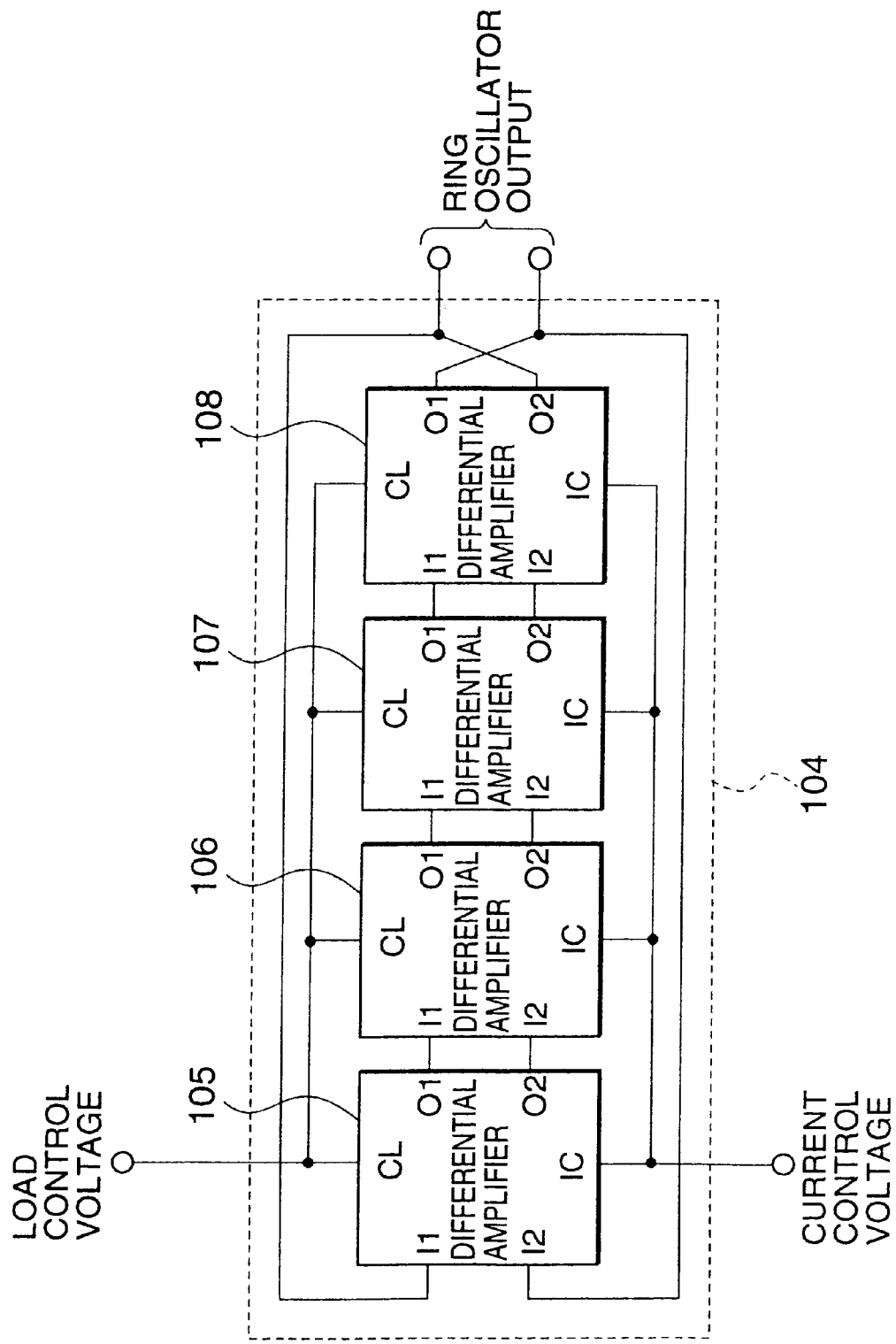
FIG. 14 is a block circuit diagram of a ring oscillator shown in FIG. 13.
Figure 15:
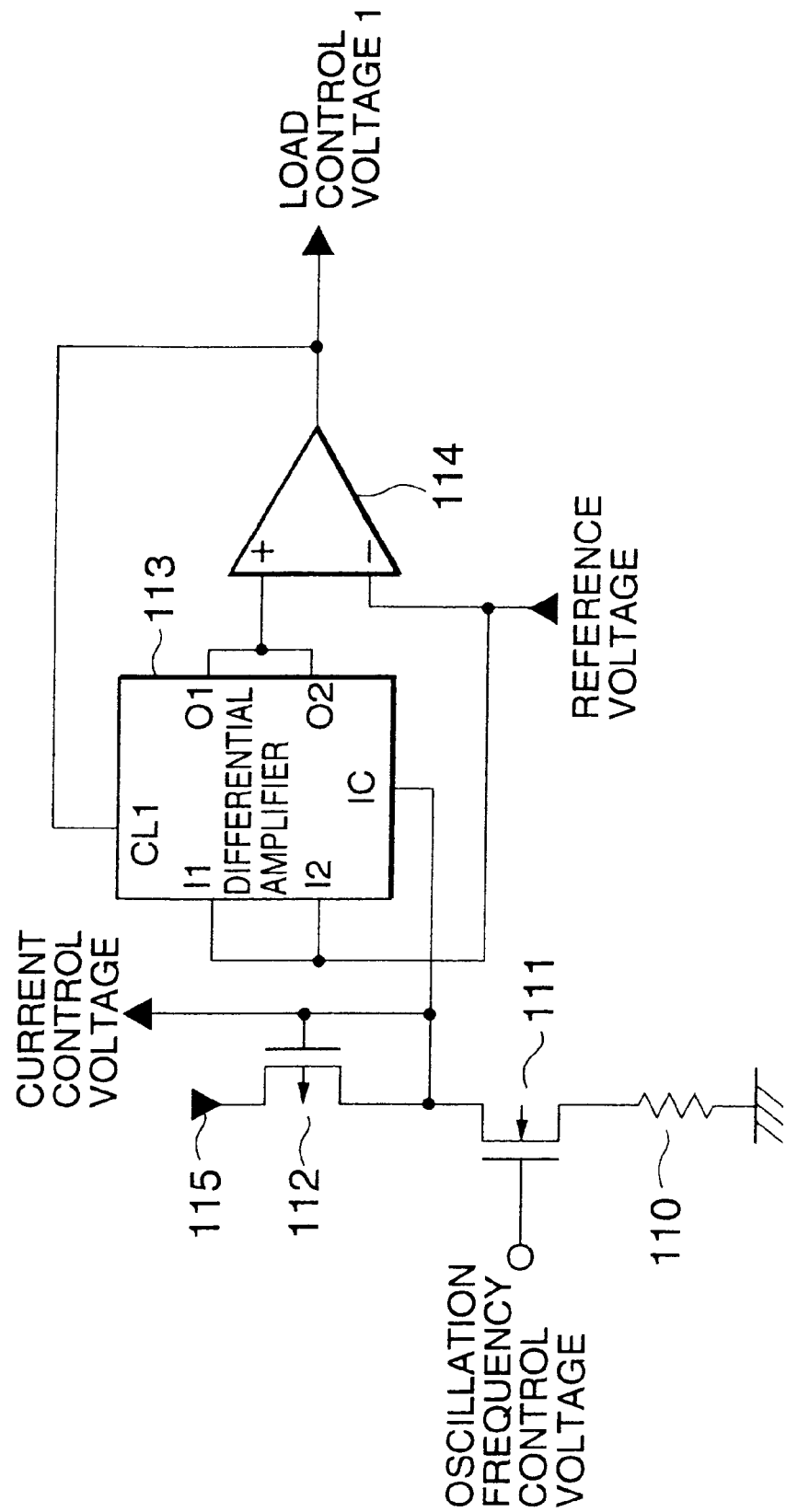
FIG. 15 is a circuit diagram of a ring oscillator control circuit shown in FIG. 13.
Figure 16:
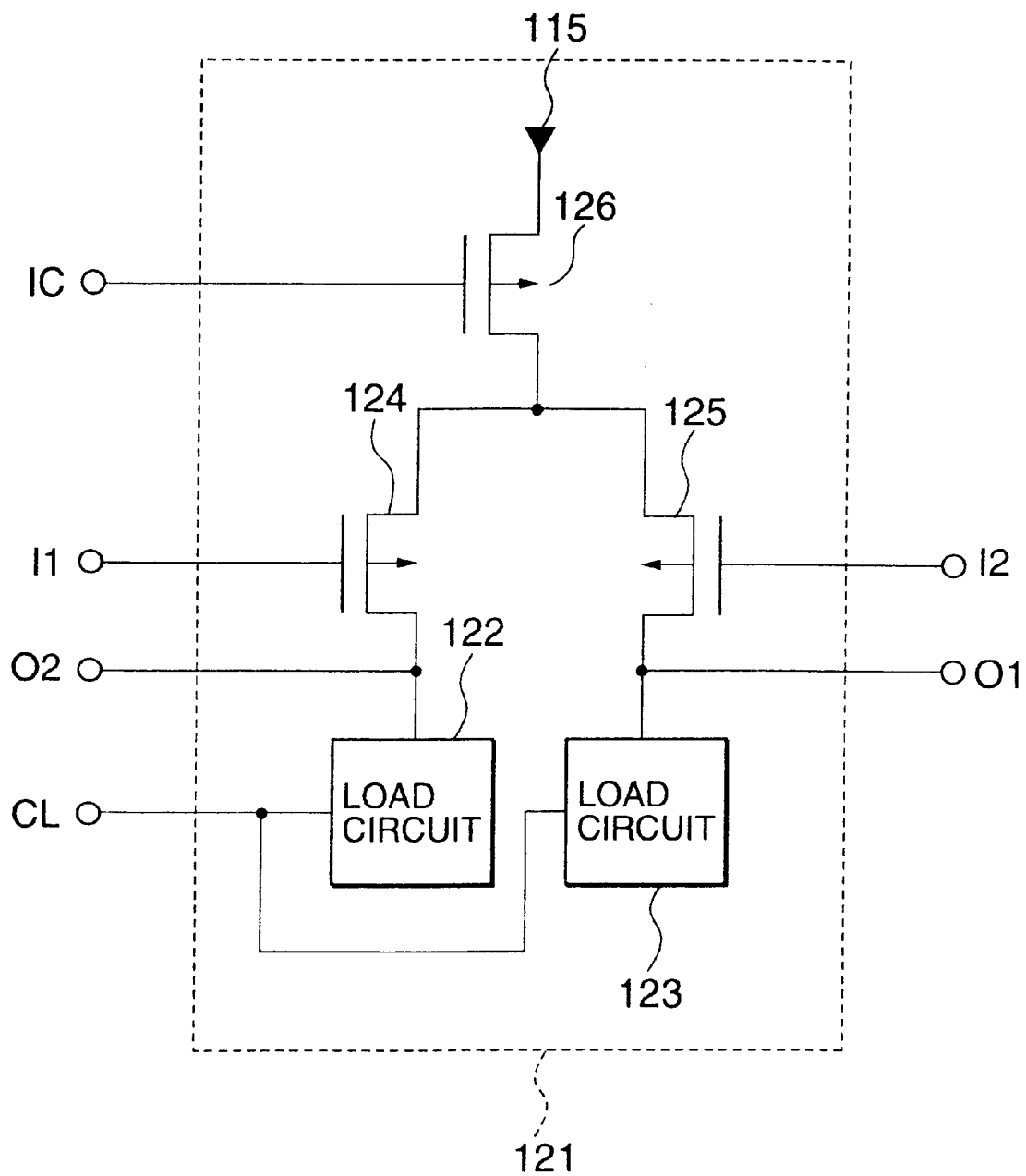
FIG. 16 is a circuit diagram of a differential amplifier shown in FIG. 14 or 15.
Figure 17:
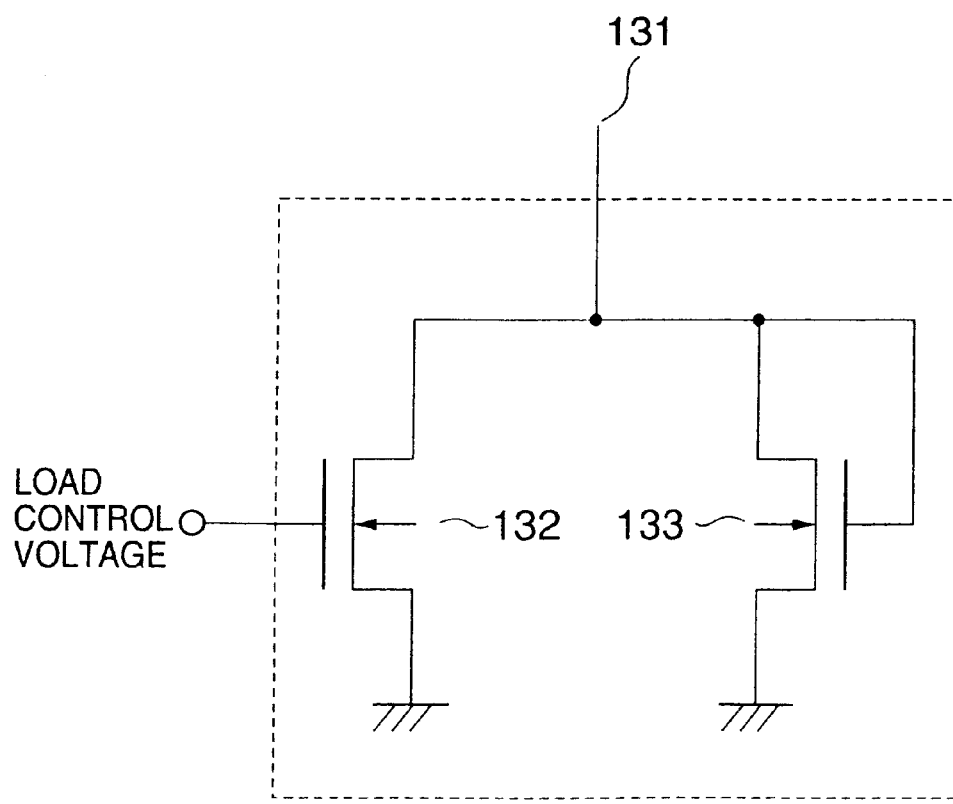
FIG. 17 is a circuit diagram of a load circuit shown in FIG. 16.

FIG. 12 shows a modification of the load circuit shown in FIG. 10, in which an NMOSFET 90 is added to the load circuit shown in FIG. 10. This modification can realize a voltage-controlled oscillator, which can operate similarly to the voltage-controlled oscillator shown in FIG. 6. When the circuit shown in FIG. 12 is used, it is possible to reduce the output impedance due to the provision of the NMOSFET 90, with a small operating current with which all of the transistors of the load circuit shown in FIG. 10 may operate in the saturation region and the output impedance may be increased. Therefore, it is possible to solve the problem of the load circuit shown in FIG. 10 that the oscillation is stopped due to a relative variation of operations of the transistors when the operating current is mall enough to operate all of the transistors thereof in the saturation region. Consequently, even if the in-phase output voltage is lowered and the preciseness, etc., of the operation is degraded, it is possible to reliably obtain the oscillation output.

According to the present invention, it is possible to provide a voltage-controlled oscillator capable of stably oscillating in a wide frequency range. By increasing the number of parallel-connected load transistors of the load circuit to increase the number of load control voltages, it is possible to arbitrarily widen the oscillation frequency range of the voltage-controlled oscillator. Since the reference voltage of the voltage-controlled oscillator can be set to a low value compared with that of. the conventional oscillator, the transistors constituting the load circuit can be easily operated in the linear region, so that it is easier to reduce the output impedance of the differential amplifiers constituting the ring oscillator. With the latter advantage, the operating current range can be widened.

Further, it is possible to realize a voltage-controlled oscillator regardless of the voltage value of the reference voltage, which is the input for determining the in-phase output voltage, and regardless of the threshold voltages of the MOSFET's.

What is claimed is:

1. A voltage-controlled oscillator, comprising:
a ring oscillator including a plurality of differential amplifiers each having a first input terminal, a second input terminal, a first output terminal, a second output terminal and a current limiting terminal, said first and second input terminals of the plurality of said differential amplifiers and said first and second output terminals of said differential amplifiers corresponding thereto being ring-connected, each said differential amplifier comprising a first load circuit connected to said first output terminal thereof and a second load circuit connected to said second output terminal thereof, said first and second load circuits operating always in a linear operating region,
wherein each said differential amplifier includes:
a first transistor connected between a first power source line and a first node and having a gate supplied with a current control voltage,
a second transistor connected between said first node and said first output terminal thereof and having a gate supplied with a first input signal,
a third transistor connected between said first node and said second output terminal thereof and having a gate supplied with a second input signal, wherein said first load circuit is connected between said first output terminal and a second power source line and said second load circuit connected between said second output terminal and said second power source line, and wherein said first load circuit includes:
a fourth transistor connected between said first output terminal thereof and said second power source line and having a gate supplied with a first load control voltage, and
a fifth transistor connected between said first output terminal thereof and said second power source line and having a gate supplied with a second load control voltage, and wherein said second load circuit includes:
a sixth transistor connected between said second output terminal thereof and said second power source line and having a gate supplied with the first load control voltage, and
a seventh transistor connected between said second output terminal thereof and said second power source line and having a gate supplied with the second load control voltage.

2. A voltage-controlled oscillator as claimed in claim 1, wherein the current amplification of said fourth transistor is different from the current amplification of said fifth transistor and the current amplification of said sixth transistor is different from the current amplification of said seventh transistor.

3. A voltage-controlled oscillator as claimed in claim 1, wherein the gate width/gate length ratio of said fourth transistor is different from the gate width/gate length ratio of said fifth transistor and the gate width/gate length ratio of said sixth transistor is different from the gate width/gate length ratio of said seventh transistor.

4. A voltage-controlled oscillator as claimed in claim 1, further comprising a ring oscillator control circuit responsive to an oscillation frequency control voltage for generating the first load control voltage and the second load control voltage different from the first load control voltage.

5. A voltage-controlled oscillator as claimed in claim 4, wherein said ring oscillator control circuit comprises a first load control voltage generator circuit responsive to the oscillation frequency control voltage and a reference voltage for generating the first load control voltage and a second load control voltage generator circuit responsive to the first load control voltage for generating the second load control voltage proportional to the first load control voltage.

6. A voltage-controlled oscillator, comprising:
a ring oscillator including a plurality of differential amplifiers each having a first input terminal, a second input terminal, a first output terminal, a second output terminal and a current limiting terminal, said first and second input terminals of the plurality of said differential amplifiers and said first and second output terminals of said differential amplifiers corresponding thereto being ring-connected, each said differential amplifier comprising a first load circuit connected to said first output terminal thereof and receiving first and second load control voltages and a second load circuit connected to said second output terminal thereof and receiving the first and second load control voltages, said first and second load circuits responsive to the first and second load control voltages for operating always in a linear operating region, and a load control voltage generator circuit for generating the first load control voltage and the second load control voltage different from the first load control voltage.

7. A voltage-controlled oscillator as claimed in claim 6, wherein said first load circuit comprises a first transistor connected between the first output terminal end a first power source line and having a gate supplied with the first load control voltage and a second transistor connected between said first output terminal and said first power source line and having a gate supplied with the second load control voltage, said second load circuit comprises a third transistor connected between said second output terminal and said first power source in line and having a gate supplied with the first load control voltage and a fourth transistor connected between said second output terminal and said first power source line and having a gate supplied with the second load control voltage, wherein the first and second load control voltages are supplied such that, when said first and third transistors are in saturation region, said second and fourth transistors are in linear region.

8. A voltage-controlled oscillator comprising:
a ring oscillator containing a plurality of differential amplifiers, each of said plurality of differential amplifiers including a first load circuit and a second load circuit, said first load circuit and said second load circuit each including first and second transistors; and
a control circuit for controlling said plurality of differential amplifiers, said control circuit including a first circuit which generates a first load control signal and a second circuit which generates a second load control signal based on said first load control signal, said first load control signal and said second load control signal being supplied to a control terminal of said first transistor and a control terminal of said second transistor,
wherein said second circuit includes a third transistor connected between a first node and a first voltage line and having a control terminal receiving said first load control signal; a fourth transistor connected between a second voltage line and said first node and having a control terminal connected to said first node; a fifth transistor connected between a second voltage line and a second node and having a control terminal connected to said first node; a sixth transistor connected between said second node and said first voltage line and a control terminal connected to said second node; and said second circuit outputs a signal on said second node as said second load control signal.

9. The voltage-controlled oscillator as claimed in claim 8, wherein ratios of gate widths-to-gate lengths of said third, fourth, fifth and sixth transistors are set to values which make the first transistor in each of said first and second load circuits operating in a linear region, even when the second transistor in each of said first and second load circuits operates in a saturation region.

10. The voltage-controlled oscillator as claimed in claim 8, wherein said third and sixth transistors are NMOS transistors, and said fourth and fifth transistors are PMOS transistors.

11. The voltage-controlled oscillator as claimed in claim 1, further comprising:
a control circuit for controlling said plurality of differential amplifiers, said control circuit including a first load control signal generating circuit which generates a first load control signal and a second load control signal generating circuit which generates a second load control signal based on said first load control signal.

12. The voltage-controlled oscillator as claimed in claim 11, wherein said second load control signal generating circuit includes an eighth transistor connected between a second node and said second power source line and having a control terminal receiving said first load control signal; a ninth transistor connected between said first power source line and said second node and having a control terminal connected to said second node; a tenth transistor connected between said first power source line and a third node and having a control terminal connected to said second node; an eleventh transistor connected between said third node and said second power source line and a control terminal connected to said third node; and said second load control signal generating circuit outputting a signal on said third node as said second load control signal.

13. The voltage-controlled oscillator as claimed in claim 12, wherein ratios of gate widths-to-gate lengths of said eighth, ninth, tenth, and eleventh transistors are set to values which make said fourth transistor and sixth transistor of said first and second load circuits operating in a linear region, even when said fifth and seventh transistors of said first and second load circuits operates in a saturation region.

14. The voltage-controlled oscillator as claimed in claim 6, wherein said load control voltage generator circuit includes a first load control voltage generating circuit which generates a first load control voltage and a second load control voltage generating circuit which generates a second load control voltage based on said first load control voltage.

15. The voltage-controlled oscillator as claimed in claim 14, wherein said second load control voltage generating circuit includes a first transistor connected between a first node and a first power source line and having a control terminal receiving said first load, control voltage; a second transistor connected between a second power source line and said first node and having a control terminal connected to said first node; a third transistor connected between said second power source line and a second node and having a control terminal connected to said first node; a fourth transistor connected between said second node and said first power source line and a control terminal connected to said second node; and said second load control voltage generating circuit outputting a voltage on said second node as said second load control voltage.

* * * * *